US007292729B2

(12) United States Patent
Ageyev et al.

(10) Patent No.: US 7,292,729 B2
(45) Date of Patent: Nov. 6, 2007

(54) DEVICE, SYSTEM, AND METHOD FOR CONTIGUOUS COMPRESSED DATA

(75) Inventors: Igor Iosifovich Ageyev, Tucson, AZ (US); Sangram Singh Ghoman, Tucson, AZ (US); Jonathan Michael Hale, Tucson, AZ (US); Lih-Chung Kuo, San Jose, CA (US); Joseph M. Swingler, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 728 days.

(21) Appl. No.: 10/841,855

(22) Filed: May 7, 2004

(65) Prior Publication Data

US 2005/0262479 A1    Nov. 24, 2005

(51) Int. Cl.
*G06K 9/36* (2006.01)
(52) U.S. Cl. ..................................... 382/232
(58) Field of Classification Search ............ 382/232, 382/244, 305; 345/555
See application file for complete search history.

(56) References Cited

U.S. PATENT DOCUMENTS

| 5,493,574 | A | 2/1996 | McKinley | 371/40.1 |
|---|---|---|---|---|
| 5,574,952 | A | 11/1996 | Brady et al. | 395/888 |
| 5,652,857 | A | 7/1997 | Shimoi et al. | 395/440 |
| 5,682,497 | A * | 10/1997 | Robinson | 711/103 |
| 5,734,892 | A | 3/1998 | Chu | 395/612 |
| 6,000,009 | A | 12/1999 | Brady | 711/112 |
| 6,240,419 | B1 * | 5/2001 | Franaszek | 707/101 |
| 6,243,081 | B1 | 6/2001 | Goris et al. | 345/202 |
| 6,452,602 | B1 | 9/2002 | Morein | 345/555 |

* cited by examiner

*Primary Examiner*—Phuoc Tran
(74) *Attorney, Agent, or Firm*—Kunzler & McKenzie

(57) ABSTRACT

A device, system and method of data compression are provided. The invention includes a receiving module that may be a memory module. The invention also includes a pointer module storing a pointer to a location within the receiving module. The invention allocates a receiving space within the receiving module and associates the pointer with the receiving space. The pointer may be associated with the beginning of the receiving space. The invention compresses a first data block and directs the compressed first data block to the receiving space at the location indicated by the pointer. The invention further associates the pointer with the location in the receiving space contiguous with the received compressed first data block. The invention compresses a second data block and directs the compressed second data block to the location within the receiving space indicated by the pointer. The invention compresses data as contiguous compressed data blocks.

30 Claims, 6 Drawing Sheets

DEVICE, SYSTEM, AND METHOD FOR CONTIGUOUS COMPRESSED DATA

BACKGROUND OF THE INVENTION

1. Field of the Invention

This invention relates to compressing data and more particularly relates to producing contiguous compressed data.

2. Description of the Related Art

A data processing device such as a server, computer, personal digital assistant, router, telephone, cellular telephone, and network often compresses data into compressed data. The compressed data has a reduced footprint in memory and in a storage device, and can be transmitted with less bandwidth. The data processing device typically compresses data by dividing the data into one or more data blocks and compressing each data block with a compression algorithm such as the adaptive lossless data compression ("ALDC") algorithm.

FIG. 1 is a block diagram illustrating data compression 100 in accordance with the current practice. As depicted, data 120 is divided into one or more data blocks 105. The data processing device (not shown) allocates one or more receiving spaces 110 in a receiving medium such as a memory module or a storage device for each data block 105 and compresses each data block 105 into a compressed data block 115. Each allocated receiving space 110 receives the corresponding compressed data block 115. The receiving space 110 is often larger than the data block 105, as applying a compression algorithm to some data blocks 105c may create a compressed data block 115c larger than the original data block 105c.

Since each receiving space 110 must be larger than each data block 105, the receiving spaces 110 for all compressed data blocks 115 often exceeds the size of the data 120. In addition, the compressed data blocks 115 are discontiguous within the receiving spaces 110. The data processing device must further consolidate the discontiguous compressed data blocks 115 and free the excess receiving space to achieve a reduced data footprint.

What is needed is a process, apparatus, and system that compresses data into contiguous compressed data. Beneficially, such a process, apparatus, and system would reduce the bandwidth of the receiving medium that receives the compressed data.

SUMMARY OF THE INVENTION

The present invention has been developed in response to the present state of the art, and in particular, in response to the problems and needs in the art that have not yet been fully solved by currently available data compression methods and devices. Accordingly, the present invention has been developed to provide a method, device, and system for data compression that overcome many or all of the above-discussed shortcomings in the art.

The device for data compression is provided with a logic unit containing a plurality of modules configured to functionally execute the necessary steps of data compression. These modules in the described embodiments include a receiving module, a pointer module, and a control module.

The receiving module receives a plurality of compressed data blocks. In one embodiment, the receiving module is a memory module such as a dynamic random access memory ("DRAM"). In an alternate embodiment, the receiving module is a storage module such as a hard disk drive. In a certain embodiment, the receiving module is a transmission module such as an Ethernet network interface card ("NIC").

The pointer module stores a pointer. The pointer is associated with a location within the receiving module. In one embodiment, the pointer is associated with a location in a memory module. In an alternate embodiment, the pointer is associated with a location on a hard disk drive. In a certain embodiment, the pointer is associated with a location within a NIC buffer.

The control module allocates a receiving space within the receiving module. In one embodiment, the receiving space is a block of memory locations. In an alternate embodiment, the receiving space is a location on a hard disk drive. In a certain embodiment, the receiving space is a block of buffer locations.

The control module associates the pointer with the receiving space. In addition, the control module compresses a first data block and directs the compressed first data block to the receiving space at the location associated with the pointer. The control module associates the pointer with the location in the receiving space contiguous with the first compressed data block. In addition, the control module compress a second data block and directs the compressed second data block to the receiving space at the location associated with the pointer. The second compressed data block is contiguous with the first compressed data block.

A system of the present invention is also presented for data compression. The system may be embodied in a data processing network. In particular, the system, in one embodiment, includes receiving device, a pointer module, a data processing device, and a communications channel.

The receiving device receives a plurality of compressed data blocks. The receiving device may be a memory device, a storage device, and a transmission device. The pointer module stores a pointer associated with a location within the receiving device. The receiving device and the data processing device communicate through the communications channel.

In one embodiment, the data processing device allocates a receiving space within the receiving device and associates the pointer with the receiving space. In an alternate embodiment, the receiving device allocates the receiving space and associates the pointer with the receiving space responsive to a command from the data processing device. The data processing device compress a first data block and directs the compressed first data block to the receiving space at the location associated with the pointer. In one embodiment, the data processing module associates the pointer with the location contiguous with the first compressed data block within the receiving space.

In an alternate embodiment, the receiving device associates the pointer with the location contiguous with the first compressed data block within the receiving space. The data processing device compresses a second data block and directs the compressed second data block to the receiving space at the logical location of the pointer. The compressed first data block and the compressed second data block are contiguous within the receiving module.

A method of the present invention is also presented for data compression. The method in the disclosed embodiments substantially includes the steps necessary to carry out the functions presented above with respect to the operation of the described apparatus and system. In one embodiment, the process includes allocating a receiving space, associating a pointer, compressing a first and second data block, directing the compressed first data block to the receiving space, associating the pointer with the location in the receiving space contiguous with the compressed first data block, and directing the compressed second data block to the receiving space.

The method allocates a receiving space to receive a plurality of compressed data blocks and associates a pointer with the receiving space. In addition, the method compresses a first data block and a second data block and directs the compressed first data block to the receiving space at the location associated with the pointer. The method associates the pointer with the location of the receiving space contiguous with the compressed first data block. The method further directs the compressed second data block to the location within the receiving space associated with the pointer.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

The present invention compresses data into contiguous compressed data blocks. The present invention may reduce the receiving space required to compress data. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
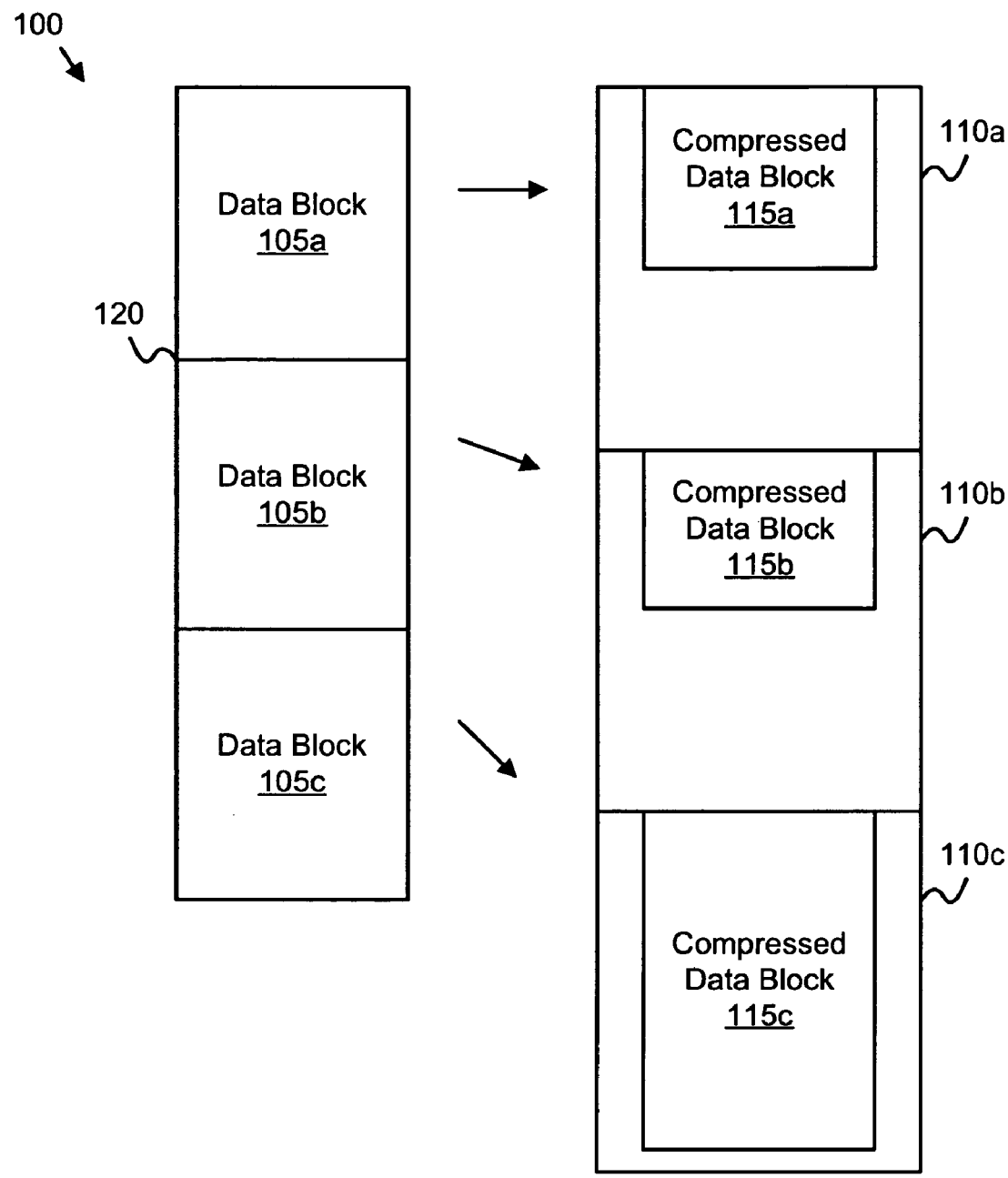
FIG. 1 is a block diagram illustrating data compression of the current practice.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the invention.

Figure 2:
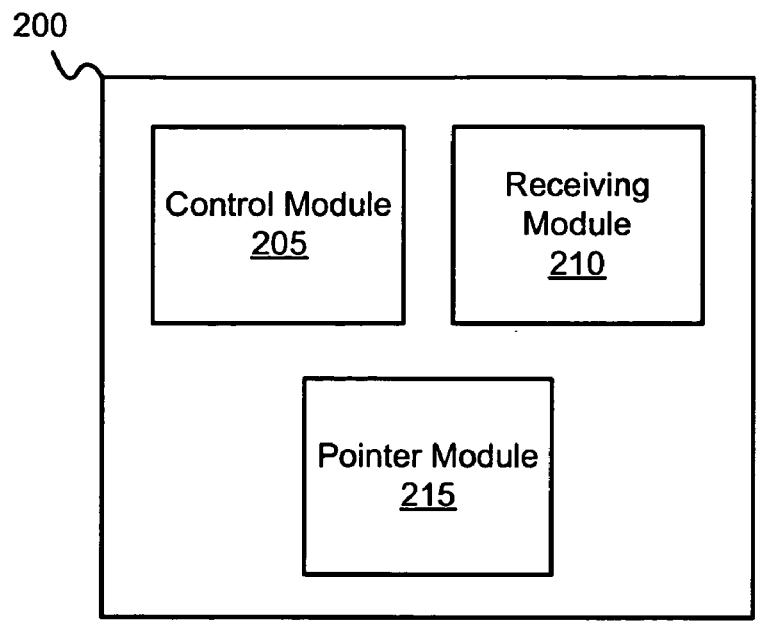
FIG. 2 is a block diagram illustrating one embodiment of a data compression device of the present invention.

FIG. 2 is a block diagram illustrating one embodiment of a data compression device 200 of the present invention. The data compression device 200 compresses a plurality of data blocks as a plurality of contiguous compressed data blocks. The data compression device 200 includes a control module 205, a receiving module 210, and a pointer module 215.

The receiving module 210 receives a plurality of compressed data blocks. In one embodiment, the receiving module 210 is a memory module such as a dynamic random access memory ("DRAM") module. In an alternate embodiment, the receiving module 210 is a storage module such as a hard disk drive. In a certain embodiment, the receiving module 210 is a transmission module such as an Ethernet network interface card ("NIC").

The pointer module 215 stores a pointer. The control module 205 may associate the pointer with a location within the receiving module 210. In one embodiment, the pointer is associated with a location in the memory module. In an alternate embodiment, the pointer is associated with a location on the hard disk drive. In a certain embodiment, the pointer is associated with a buffer location within the NIC.

The control module 205 allocates a receiving space within the receiving module 210. The receiving space is sufficiently large to receive compressed data created from data by a compression algorithm. In one embodiment, the receiving space is a block of memory locations. The receiving space may also be one or more blocks of memory locations, linked together and presented as a single logical block. In an alternate embodiment, the receiving space is a block of locations on the hard disk drive. In a certain embodiment, the receiving space is a block of buffer locations in the NIC. The receiving space may also be one or more blocks of buffer locations, linked together and presented as a single logical block.

The control module 205 associates the pointer with the receiving space. In one embodiment, the control module 205 associates the pointer with the beginning of the receiving space. The control module 205 divides the data into a plurality of data blocks and compresses a first data block. In one embodiment, the control module 205 compresses the first data block with the adaptive lossless data compression ("ALDC") algorithm. In an alternate embodiment, the control module 205 compresses the first data block with streaming lossless data compression ("SLDC") algorithm.

The control module 205 directs the compressed first data block to the receiving space of the receiving module 210 at the location associated with the pointer. In a certain embodiment, the control module 205 stores the compressed first data block in DRAM. The control module 205 associates the pointer with the location within the receiving space contiguous with the compressed data first block. In one embodiment, the control module 205 associates the pointer with the receiving space contiguous with the end of the received compressed first data block. In addition, the control module 205 compresses a second data block and directs the compressed second data block to the location in the receiving space associated the pointer. In one embodiment, the control module 205 stores the compressed second data block in DRAM. The compressed second data block is contiguous with the compressed first data block. The data compression device 200 compresses data as contiguous compressed data blocks using the pointer to direct each compressed data block to the receiving space contiguous to received compressed data blocks.

Figure 3:
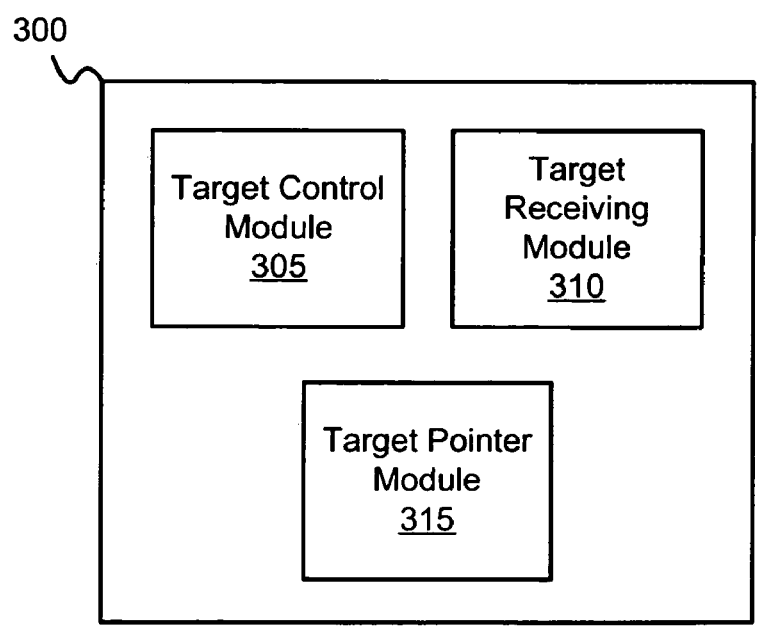
FIG. 3 is a block diagram illustrating one embodiment of a compressed data receiving device of the present invention.

FIG. 3 is a block diagram illustrating one embodiment of a compressed data receiving device 300 of the present invention. The compressed data receiving device 300 receives a plurality of compressed data blocks as contiguous compressed data blocks. The compressed data receiving device 300 includes a target control module 305, a target receiving module 310, and a target pointer module 315.

The target receiving module 310 receives a plurality of compressed data blocks. In one embodiment, the target receiving module 310 is a memory module. In an alternate embodiment, the target receiving module 310 is a storage module. In a certain embodiment, the target receiving module 310 is a transmission module. The pointer module 315 stores a pointer associated with a location in the receiving module 310. In one embodiment, the target control module 305 receives a command to receive a plurality of compressed data blocks. In a certain embodiment, the command specifies the size of a receiving space. The target control module 305 allocates the receiving space in the target receiving module 310.

The target receiving module 310 receives a compressed first data block at the location associated with the pointer. The target control module 305 associates the pointer with the location in the receiving space contiguous with the compressed data first block. In one embodiment, the target control module 305 associates the pointer with the receiving space contiguous with the end of the received compressed first data block. The target receiving module 310 receives a compressed second data block at the location associated with the pointer. The compressed first data block and the compressed second data block are contiguous in the receiving space of the target receiving module 310. The compressed data receiving device 300 receives the compressed data blocks as contiguous compressed data blocks.

Figure 4:
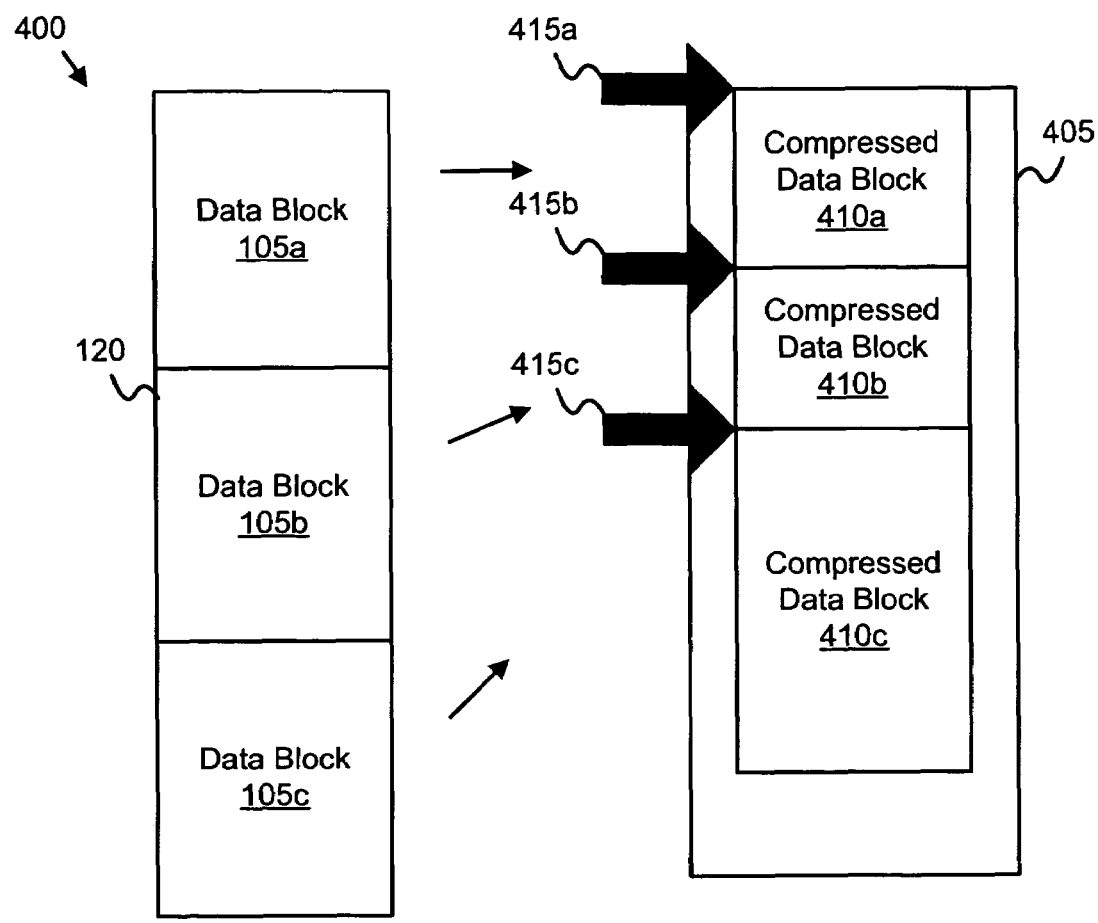
FIG. 4 is a block diagram illustrating one embodiment of data compression in accordance with the present invention.

FIG. 4 is a block diagram illustrating one embodiment of data compression 400 in accordance with the present invention. As depicted, data 120 is divided into a first data blocks 105*a*, a second data block 105*b*, and a third data block 105*c*. A receiving space 405 is allocated for the compressed data. A pointer 415 is associated with a plurality of locations in the receiving space 405. For example, the pointer 415 may be pointer 415*a*, pointer 415*b*, and pointer 415*c*. In one embodiment, the pointer 415*a* is associated with the beginning of the receiving space 405. Because the receiving space 405 receives the compressed data blocks 410 as contiguous compressed data blocks 410, the receiving space 405 may have a smaller size than the data 120.

Each data block 105 is compressed into a compressed data block 410. The receiving space 405 receives the compressed first data block 410*a* at the location associated with the pointer 415*a*. The pointer 415 is further associated with the location in the receiving space 405 contiguous with the compressed first data block 410*a*, the location of the pointer 415*b*. The receiving space 405 receives the compressed second data block 410*b* at the location associated with the pointer 415*b* and the pointer 415 is associated with the location in the receiving space 405 contiguous with the compressed second data block 410*b*, the location associated with pointer 415*c*. The receiving space 405 further receives the compressed third data block 410*c* at the location associated with the pointer 415*c*. The data compression 400 compresses and receives the compressed data blocks 410 as contiguous compressed data blocks 410.

Figure 5:
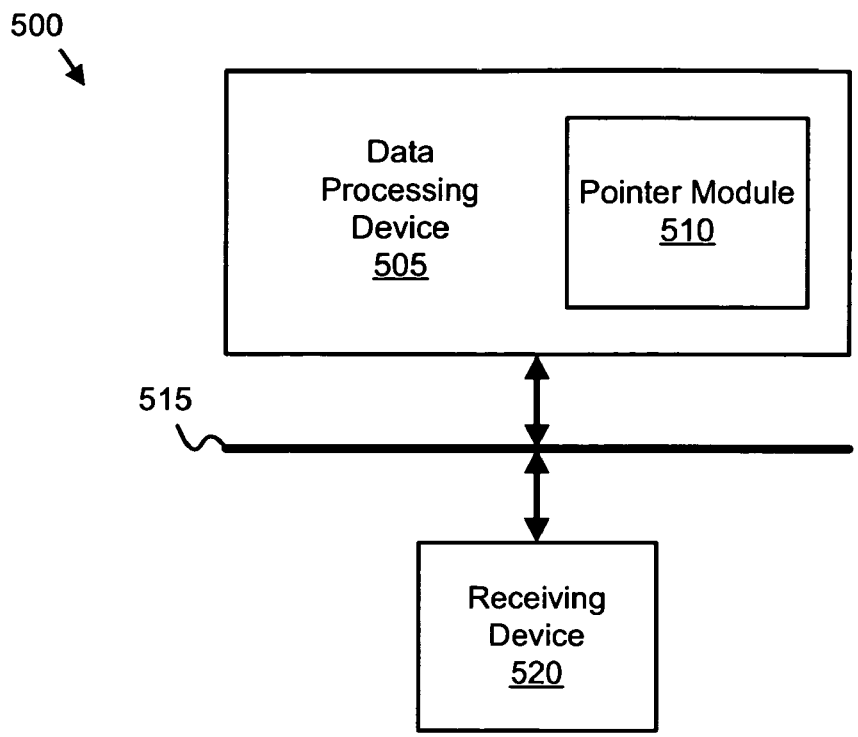
FIG. 5 is a block diagram illustrating one embodiment of a data compression system of the present invention.

FIG. 5 is a block diagram illustrating one embodiment of a data compression system 500 of the present invention. The data compression system 500 compresses data 120 as contiguous compressed data blocks 410 assembled in a receiving device 520. The data compression system 500 includes a data processing device 505, a pointer module 510, a communications channel 515, and a receiving device 520. The data processing device 505 may be a server, a computer, a personal digital assistant, a router, a telephone, a cellular telephone, and a network. Although for simplicity the data compression system 500 is depicted with one data processing device 505, one pointer module 510, one communications channel 515, and one receiving device 520, any number of data processing devices 505, pointer modules 510, communications channels 515, and receiving devices 520 may be employed.

The data processing device 505 and the receiving device 520 communicate through the communications channel 515. The pointer module 510 stores a pointer 415 associated with a location in the receiving device 520. In the depicted embodiment, the pointer module 510 is included in the data processing system 505. The data processing device 505 allocates a receiving space 405 in the receiving device 520 and associates the pointer 415 with the receiving space. In addition, the data processing device 505 compresses the data 120 by dividing the data 120 into a plurality of data blocks 105 and applying a compression algorithm to each data block 105. The data processing device 505 transmits the compressed first data block 410a through the communications channel 515 to the receiving space 405 of the receiving device 420 associated with the pointer 415a and associates the pointer 415 with the receiving space 405 location contiguous with the received compressed first data block 410a. In addition, the data processing device 505 transmits the compressed second data block 410b through the communications channel 515 to the receiving space associated with the pointer 410b. The data compression system 500 assembles contiguous compressed data blocks 410 in the receiving device 520.

Figure 6:
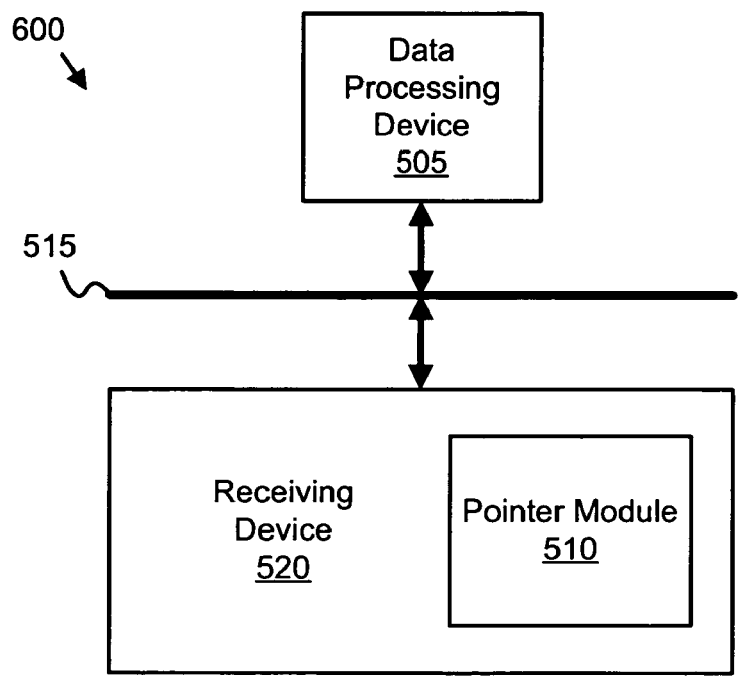
FIG. 6 is a block diagram illustrating one alternate embodiment of a data compression system of the present invention.

FIG. 6 is a block diagram illustrating an alternate embodiment of a data compression system 600 of the present invention. The data compression system 600 includes the data processing device 505, the pointer module 510, the communications channel 515, and the receiving device 520 of FIG. 5 with the pointer module 510 included in the receiving device 520. In one embodiment, the receiving device 520 is the compressed data receiving device 300 of FIG. 3. Although for simplicity the data compression system 600 is depicted with one data processing device 505, one pointer module 510, one communications channel 515, and one receiving device 520, any number of data processing devices 505, pointer modules 510, communications channels 515, and receiving devices 520 may be employed.

The data processing device 505 and the receiving device 520 communicate through the communications channel 515. The data processing device 505 communicates a command to the receiving device 520 to receive a plurality of compressed data blocks 410. The receiving device 520 allocates a receiving space 405 to receive the compressed data blocks. In one embodiment, the command specifies the size of the receiving space 405. The receiving device 520 associates the pointer 415 with the receiving space 405.

The receiving device 520 receives a compressed first data block 410a from the data processing device 505 through the communications channel 515 at the location associated with the pointer 415a. In addition, the receiving device 520 associates the pointer 415 with the receiving space 405 contiguous with the received compressed first data block 410a. The receiving device 520 receives a compressed second data block 410b from the data processing device 505 at the location associated with the pointer 415b. The data compression system 600 receives compressed data blocks 410 as contiguous compressed data blocks 410.

Figure 7:
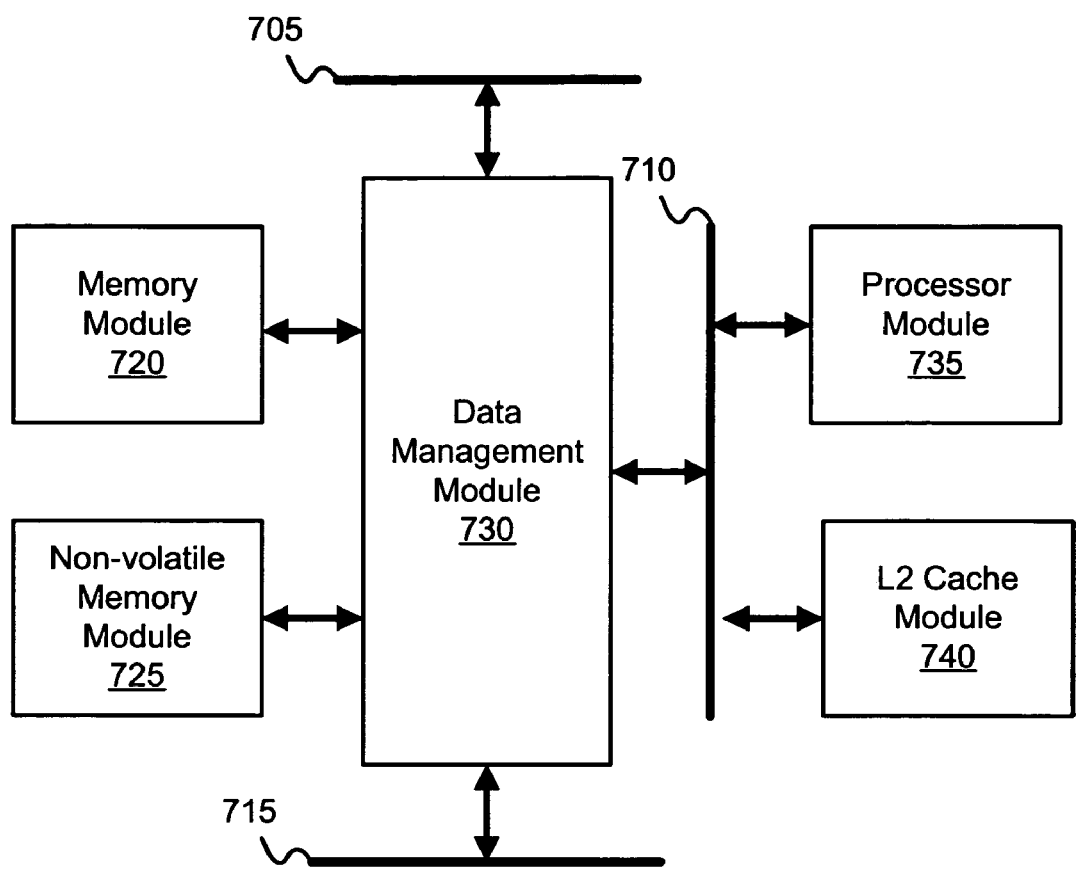
FIG. 7 is a block diagram illustrating one alternate embodiment of a data compression device of the present invention.

FIG. 7 is a block diagram illustrating an alternate embodiment of a data compression device 700 of the present invention. The data compression device 700 compresses and transmits data 120 as contiguous compressed data blocks 410. The data compression device 700 includes a first communications bus 705, a processor bus 710, a second communications bus 715, a memory module 720, a data management module 730, a processor 735, and a level two ("L2") cache module 740. In one embodiment, the data compression device 600 also includes a non-volatile memory module 725. In a certain embodiment, the processor 735 and the L2 cache module 740 are integrated into a single device.

In a certain embodiment, the memory module 720 is a DRAM module. In one embodiment, the first communications bus 705 and the second communications bus are peripheral component interconnect ("PCI") buses. The data management module 730 manages data transfers between the first communications bus 705, the second communications bus 715, the processor bus 710, and the memory module 720.

In one embodiment, the data management module 730 transfers data to a destination as compressed data blocks 410. The destination may be a device connected to the first communications bus 705, a device connected to the second communications bus 715, and the memory module 720. The data management module 730 includes a pointer module (not shown) storing a pointer 415.

The data management module 730 may receive data 120 through the processor bus 710, the first communications bus 705, the second communications bus 715, and the memory module 720. In addition, the data management module 730 divides the data 120 into a plurality of data blocks 105. The data management module 730 allocates a receiving space 405 at the destination. The data management module 730 associates the pointer 415 with a location of the receiving space 405, compresses a first data block 105a, and directs the compressed first data block 410a to the location associated with the pointer 415. In addition, the data management module 730 associates the pointer 415 with the location in the receiving space 405 contiguous with the received compressed first data block 410a. The data management module 730 compresses and directs a second data block 105b to the location associated with the pointer 415. The data compression device 700 compresses the data 120 as compressed data blocks 410 and directs the compressed data blocks 410 as contiguous compressed data blocks 410 to a destination.

Figure 8:
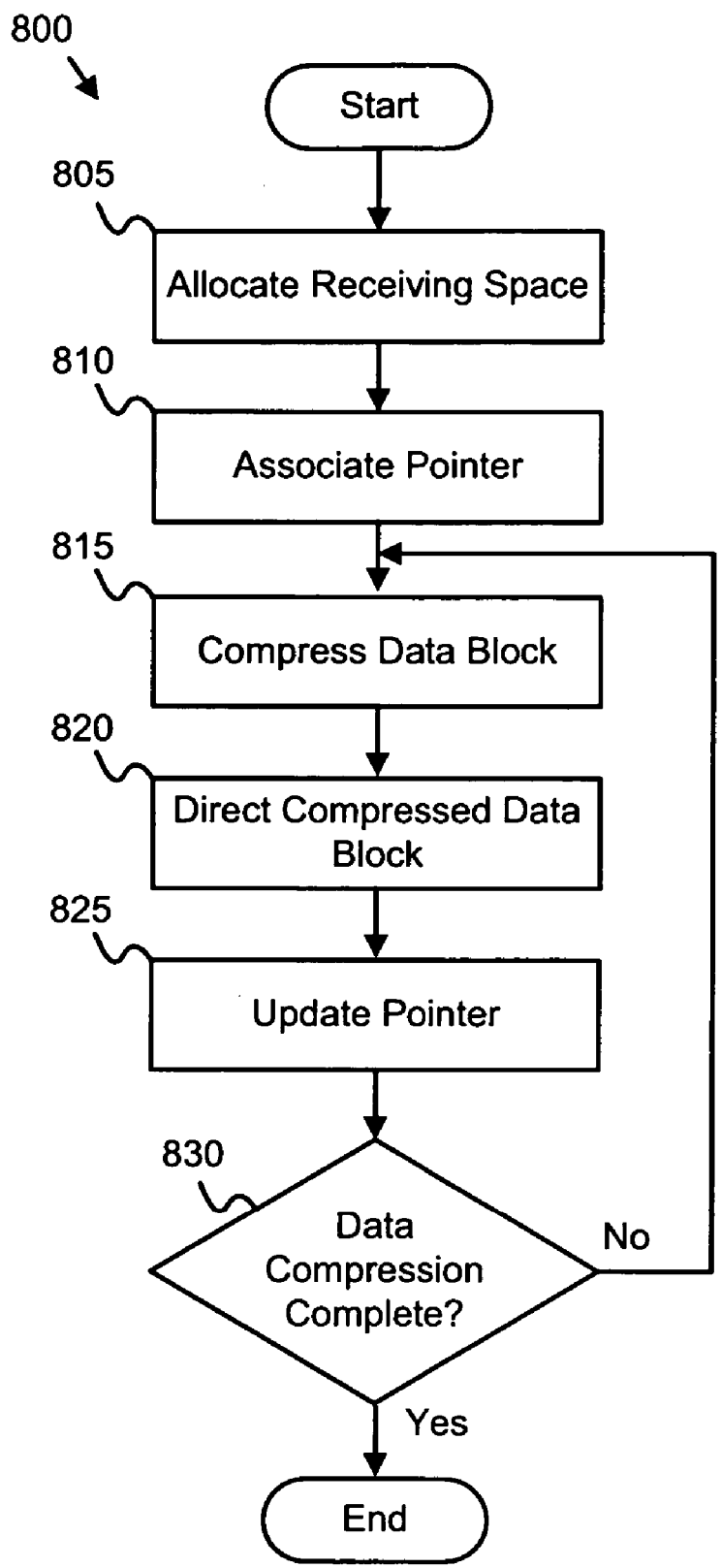
FIG. 8 is a flow chart diagram illustrating one embodiment of a data compression method in accordance with the present invention.

FIG. 8 is a flow chart diagram illustrating one embodiment of a data compression method 800 in accordance with the present invention. The data compression method 800 compresses data 120 into a plurality of contiguous compressed data blocks 410. Although for purposes of clarity the data compression method 800 is depicted in a certain sequential order, execution may be conducted in parallel and not necessarily in the depicted order.

The data compression method 800 allocates 805 a receiving space 405 to receive a plurality of compressed data blocks 410 compressed from data 120. The receiving space 405 is sufficiently large to receive each compressed data block 410. In one embodiment, the compression algorithm is the ALDC algorithm. The ALDC algorithm may have a compression ratio of two point six to one (2.6:1). In selected embodiments, by way of example, the ALDC algorithm may also have a worst case compression ratio of one to one point one two five (1:1.125). The proportion of the receiving space 405 to the data 120 may have a range of about thirty-nine percent (39%) to about one hundred and twelve point five percent (112.5%).

The data compression method 800 associates 810 a pointer 415 with the receiving space 405. The data compression method 800 compresses 715 a data block 105 into a compressed first data block 410a and directs 720 the compressed data block 410 to the location in the receiving space 405 associated with the pointer 415.

The data compression method 800 further updates 725 the pointer, associating the pointer 415 with the location of the receiving space 405 contiguous with the received compressed data block 410. In addition, the data compression method 800 determines 730 if the data compression is complete. If the data compression is complete, data compression method 800 terminates. If the data compression is not complete, the data compression method 800 loops to compress a data block 410.

In one embodiment, the data compression method 800 compresses two or more sets of data 120 with a pointer 415 for each set of data 120. Each pointer 415 is associated with a location in a unique receiving space 405 for each set of data 120. Any number of sets of data 120 may be compressed concurrently with a pointer 415 for each set of data 120. For example, the data compression method 800 may process a first data block 410 of a first set of data 120 and direct the compressed first data block 410 to the location associated with a first pointer 415 of the first set of data 120, and subsequently process a second data block 410 of a second set of data 120 and direct the compressed second data block 410 to the location associated with a second pointer 415 of the second set of data 120 prior to completing the compression of the first set of data 120. The data compression method 800 produces contiguous compressed data blocks 410 from data 120.

The present invention compresses data 120 into contiguous compressed data blocks 410. The present invention may further reduce the receiving space 405 required to receive compressed data blocks 410. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A data compression device, the device comprising:
   a receiving module configured to receive a plurality of compressed data blocks;
   a pointer module configured to store a pointer, the pointer associated with a location within the receiving module; and
   a control module configured to allocate a receiving space within the receiving module, associate the pointer with the receiving space, compress a first data block, and direct the compressed first data block to the receiving space at the location associated with the pointer, the control module further configured to associate the pointer with the location contiguous with the end of the first compressed data block within the receiving space, compress a second data block, and direct the compressed second data block to the receiving space at the location associated with the pointer, such that the compressed first data block and the compressed second data block are received contiguously by the receiving module.

2. The device of claim 1, wherein the receiving module is a memory module.

3. The device of claim 1, wherein the receiving module is a storage module.

4. The device of claim 1, wherein the receiving module is a transmission module.

5. The device of claim 1, wherein the control module compresses the first and second data blocks using an adaptive lossless data compression algorithm.

6. The device of claim 1, wherein the control module compresses the first and second data blocks using a streaming lossless data compression algorithm.

7. A compressed data receiving device comprising:
   a target receiving module configured to receive a plurality of compressed data blocks;
   a target pointer module configured to store a pointer, the pointer associated with a location within the target receiving module; and
   a target control module configured to allocate a receiving space within the target receiving module, associate the pointer with the receiving space, and receive a compressed first data block directed to the receiving space at the location associated with the pointer, the target control module further configured to associate the pointer with the location contiguous with the first compressed data block within the receiving space and receive a compressed second data block directed to the receiving space at the location associated with the pointer, such that the compressed first data block and the compressed second data block are received contiguously within the target receiving module.

8. The device of claim 7, wherein the target receiving module is a storage module.

9. The device of claim 7, wherein the target receiving module is a transmission module.

10. A system for compressing data, the system comprising:
    a receiving device configured to receive a plurality of compressed data blocks;
    a pointer module configured to store a pointer, the pointer associated with a location within the receiving module
    a data processing device configured to allocate a receiving space within the receiving device, associate the pointer with the receiving space, compress a first data block, and direct the compressed first data block to the receiving space at the location associated with the pointer, the data processing device further configured to associate the pointer with the location contiguous with the first compressed data block within the receiving space, compress a second data block, and direct the compressed second data block to the receiving space at the location associated with the pointer, such that the compressed first data block and the compressed second data block are received contiguously by the receiving module; and
    a communication channel in communication with the receiving device and the data processing device.

11. The system of claim 10, wherein the pointer module resides within the data processing device.

12. The system of claim 10, wherein the pointer module resides within the receiving device.

13. The system of claim 10, wherein the receiving module is a storage device.

14. The system of claim 10, wherein the receiving module is a memory device.

15. The system of claim 10, wherein the receiving module is a transmission device.

16. The system of claim 10, wherein the data processing device compresses the first data block and the second data block using an adaptive lossless data compression algorithm.

17. A computer readable storage medium comprising computer readable code configured to carry out a method for receiving compressed data, the method comprising:
   allocating a receiving space within a receiving medium;
   associating a pointer with the receiving space;
   compressing a first data block and a second data block;
   directing the compressed first data block to the receiving space at the location associated with the pointer;
   associating the pointer with the location of the receiving space contiguous with the received compressed first data block; and
   directing the compressed second data block to the receiving space at the location of the pointer, such that the compressed first data block and the compressed second data block are contiguous in the receiving space.

18. The computer readable storage medium of claim 17, wherein the receiving medium is a memory module.

19. The computer readable storage medium of claim 17, wherein the receiving medium is a storage module.

20. The computer readable storage medium of claim 17, wherein the receiving medium is a transmission module.

21. The computer readable storage medium of claim 17, further comprising compressing the first data block and the second data block with an adaptive lossless data compression algorithm.

22. The computer readable storage medium of claim 17, further comprising compressing the first data block and the second data block with a streaming lossless data compression algorithm.

23. The computer readable storage medium of claim 17, further comprising allocating the size of the receiving space as a proportion of the size of data to be compressed.

24. The computer readable storage medium of claim 23, further comprising allocating the size of the receiving space to be in the range of about thirty-nine percent to about one hundred and twelve point five percent of the size of the data.

25. A method for compressing data, the method comprising:
   allocating a receiving space within a receiving medium;
   associating a pointer with the receiving space;
   compressing a first data block and a second data block;
   directing the compressed first data block to the receiving space at the location associated with the pointer;
   associating the pointer with the location of the receiving space contiguous with the received compressed first data block; and
   directing the compressed second data block to the receiving space at the location of the pointer, such that the compressed first data block and the compressed second data block are contiguous in the receiving space.

26. The method of claim 25, wherein the receiving medium is a memory module.

27. The method of claim 25, wherein the receiving medium is a storage module.

28. The method of claim 25, wherein the receiving medium is a transmission module.

29. The method of claim 25, further comprising compressing the first data block and the second data block with an adaptive lossless data compression algorithm.

30. An apparatus for compressing data, the apparatus comprising:
   means for allocating a receiving space within a receiving medium;
   means for associating a pointer with the receiving space;
   means for compressing a first data block and a second data block;
   means for directing the compressed first data block to the receiving space at the location associated with the pointer;
   means for associating the pointer with the location of the receiving space contiguous with the received compressed first data block; and
   means for directing the compressed second data block to the receiving space at the location of the pointer, such that the compressed first data block and the compressed second data block are contiguous in the receiving space.

* * * * *